United States Patent
Serikawa et al.

(10) Patent No.: US 7,787,234 B2
(45) Date of Patent: Aug. 31, 2010

(54) DIGITAL SIGNAL PROCESSOR

(75) Inventors: Hiroshi Serikawa, Osaka (JP); Kenji Kuranuki, Kyoto (JP); Junichi Kurita, Osaka (JP); Tsuyoshi Yoshino, Kyoto (JP); Katsuyuki Nakamura, Osaka (JP); Hiroshi Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 509 days.

(21) Appl. No.: 11/885,458

(22) PCT Filed: May 15, 2006

(86) PCT No.: PCT/JP2006/309630

§ 371 (c)(1),
(2), (4) Date: Aug. 31, 2007

(87) PCT Pub. No.: WO2006/123597

PCT Pub. Date: Nov. 23, 2006

(65) Prior Publication Data

US 2009/0160579 A1    Jun. 25, 2009

(30) Foreign Application Priority Data

May 18, 2005 (JP) .............................. 2005-144987
Oct. 25, 2005 (JP) .............................. 2005-309360
Oct. 25, 2005 (JP) .............................. 2005-309361

(51) Int. Cl.
*H01G 9/02* (2006.01)

(52) U.S. Cl. ................... 361/525; 361/523; 361/516; 361/306.2; 361/277; 361/528

(58) Field of Classification Search ......... 361/277–278, 361/523–529, 516–519, 540–541, 306.2; 29/25.01, 25.03
See application file for complete search history.

(56) References Cited

U.S. PATENT DOCUMENTS

| | | | |
|---|---|---|---|
| 6,343,004 B1 | 1/2002 | Kuranuki et al. | |
| 6,535,375 B1 | 3/2003 | Jung et al. | |
| 6,816,358 B2 * | 11/2004 | Kida et al. | 361/540 |
| 6,836,401 B2 * | 12/2004 | Yoshida et al. | 361/538 |
| 6,977,807 B2 * | 12/2005 | Arai et al. | 361/523 |
| 6,989,982 B2 * | 1/2006 | Kobayashi et al. | 361/523 |

(Continued)

FOREIGN PATENT DOCUMENTS

EP    0 982 743 A    3/2000

(Continued)

OTHER PUBLICATIONS

European Search Report issued in European Patent Application No. EP 06746377.8 dated Apr. 13, 2010.

*Primary Examiner*—Nguyen T Ha
(74) *Attorney, Agent, or Firm*—McDermott Will & Emery LLP

(57) ABSTRACT

A digital signal processor includes a component for processing a digital signal, a power line for supplying a power to the component, and a decoupling capacitor connected between the power line and a ground. The decoupling capacitor has an equivalent series resistance larger than zero and not larger than 25 mΩ at 100 kHz and an equivalent series inductance larger than zero and not larger than 800 pH at 500 MHz. This digital signal processor does not generate a lot of digital noise, and has a small, thin size.

16 Claims, 11 Drawing Sheets

U.S. PATENT DOCUMENTS

| | | | |
|---|---|---|---|
| 7,023,685 B2 * | 4/2006 | Fujiyama et al. | 361/306.1 |
| 7,277,271 B2 * | 10/2007 | Yamaguchi et al. | 361/523 |
| 7,443,654 B2 * | 10/2008 | Asami et al. | 361/528 |
| 7,646,589 B2 * | 1/2010 | Kuriyama | 361/528 |
| 2004/0066608 A1 | 4/2004 | Takagi et al. | |
| 2004/0098849 A1 | 5/2004 | Maeda | |

FOREIGN PATENT DOCUMENTS

| | | |
|---|---|---|
| JP | 2000-031650 | 1/2000 |
| JP | 2000-138138 | 5/2000 |
| JP | 2003-133177 | 5/2003 |
| JP | 2003-197485 | 7/2003 |

* cited by examiner

Fig. 7

| ESR (mΩ) | Capacitance (μF) | Tangent of Loss Angle (%) | Leakage Current (μA) | ESL (pH) | Reduction Rate of Capacitor 23 (%) |
|---|---|---|---|---|---|
| 35.0 | 47.0 | 0.07 | 0.2 | 500 | 20 |
| 25.0 | 47.0 | 0.07 | 0.2 | 500 | 60 |
| 10.0 | 47.0 | 0.07 | 0.2 | 500 | 66 |

Fig. 8

| Distance L (mm) | Capacitance (μF) | Tangent of Loss Angle (%) | Leakage Current (μA) | ESR (mΩ) | ESL (pH) | Reduction Rate of Capacitor 23 (%) |
|---|---|---|---|---|---|---|
| 4.0 | 47.0 | 0.06 | 0.1 | 10.0 | 1000 | 20 |
| 2.0 | 47.0 | 0.07 | 0.2 | 10.0 | 800 | 60 |
| 1.0 | 47.0 | 0.08 | 0.2 | 10.0 | 500 | 66 |

US 7,787,234 B2

DIGITAL SIGNAL PROCESSOR

RELATED APPLICATIONS

This application is the U.S. National Phase under 35 U.S.C. §371 of International Application No. PCT/JP2006/309630, filed on May 15, 2006, which in turn claims the benefit of Japanese Application No. 2005-144987, filed on May 18, 2005, Japanese Application No. 2005-309360, filed on Oct. 25, 2005 and Japanese Application No. 2005-309361, filed on Oct. 25, 2005, the disclosures of which Applications are incorporated by reference herein.

TECHNICAL FIELD

The present invention relates to a digital signal processor for processing digital signals.

BACKGROUND ART

Various electronic appliances, such as audio-visual appliances, have been recently digitized rapidly. Such electronic appliances are based on specific digital signal processing techniques for converting analog or digital signals into predetermined digital formats, such as MPEG2, to compress the signals, thereby processing the signals at high speeds.

FIG. 13 is a circuit diagram of a conventional digital signal processor 5001. The processor includes a large-scale integrated circuit (LSI) 25, a power supply terminal 26, a power line 27, a decoupling capacitor 28, a DC/DC converter 29, smoothing capacitors 30 and 31, and capacitors 32 for removing noises. The power supply terminal 26 is connected to a direct current (DC) power supply 26A. The power line 27 connects between the power supply terminal 26 and the LSI 25. The decoupling capacitor 28, a solid electrolyte capacitor, is connected between the power line 27 and the ground 5001A. The DC/DC converter 29 connected to the power line 27 converts the voltage of the DC power supply 26A and outputs the converted voltage to the power line 27. The smoothing capacitor 30 is connected between an input port 29A of the DC/DC converter 29 and a ground 5001A while the smoothing capacitor 31 is connected between an output port 29B of the DC/DC converter 29 and the ground 5001A.

As the electronic appliance operates in a high speed, the LSI 25 operates at a high frequency. The LSI 25 operates at a higher frequency, and consumes a more power accordingly. In order to reduce the power consumption of the LSI 25 for reducing heat generated in the LSI 25, the voltage of the DC power supply 26A is decreased to drive the LSI 25 with a low voltage.

Upon being driven with such low voltage, the LSI 25 is influenced easily by a fluctuation of a load. When the amount of the power consumed by the LSI 25 increases rapidly due to the fluctuation of the load, the decoupling capacitor 28 supplies a current to the LSI 25 to stabilize the voltage supplied to the LSI 25.

The decoupling capacitor 28 has an equivalent series resistance (ESR) R and an equivalent series inductance (ESL) L. A current i flows from the decoupling capacitor 28 to the LSI 25. The decoupling capacitor 28 produces a dropping voltage V expressed by the following formula.

$$V = R \times i + L \times di/dt.$$

That is, upon increasing, the ESR and the ESL prevents a sufficient voltage applied to the LSI 25 from being ensured sufficiently.

FIG. 14 illustrates a profile of a digital noise of the conventional digital signal processor 5001. The digital signal processor 5001 compresses and processes a lot of signals at a high speed, and accordingly, generates a digital noise, as shown in FIG. 14. Particularly being used in a digital television carrier, this digital noise may appear as unstableness of the image on it. In order to reduce the digital noise, a large number of the capacitors 32 are connected between the LSI 25 and the ground 5001A. The number of the capacitors 32 connected to each LSI 25 is not smaller than 30, and further, are necessarily mounted close to the LSI 25. Consequently, the conventional digital signal processor requires a board having the processor mounted thereon to have multiple layers and a large size, accordingly raising its cost.

The digital noise can be evaluated after the digital signal processor has been completed, hence requiring the capacitors 32 to be determined by a cut-and-try procedure. This enables the period of time for dealing with the digital noise to be predicted, and thus, increases the period for its development, accordingly increasing its overall cost.

The ESR and ESL of the solid electrolyte capacitor used as the decoupling capacitor 28 prevent the voltage for driving the LSI 25 to be ensured sufficiently, and need to decrease.

SUMMARY OF THE INVENTION

A digital signal processor includes a component for processing a digital signal, a power line for supplying a power to the component, and a decoupling capacitor connected between the power line and a ground. The decoupling capacitor has an equivalent series resistance larger than zero and not larger than 25 mΩ at 100 kHz and an equivalent series inductance larger than zero and not larger than 800 pH at 500 MHz.

This digital signal processor does not generate a lot of digital noise, and has a small, thin size.

BRIEF DESCRIPTION OF THE DRAWINGS

FIG. 7 illustrates characteristics of the solid electrolyte capacitor according to Embodiment 1.

FIG. 8 illustrates characteristics of the solid electrolyte capacitor according to Embodiment 1.

REFERENCE NUMERALS

1 Capacitor Element (First Capacitor Element, Second Capacitor Element)
4 Positive Electrode (First Positive Electrode, Second Positive Electrode)
6 Solid Electrolyte Layer (First Solid Electrolyte Layer, Second Solid Electrolyte Layer)
8 Positive Electrode Frame
9 Negative Electrode Frame
10 Positive Electrode Terminal
10A Flat Portion (First Flat Portion)
10B Shielding Portion (First Shielding Portion)
10E Joint Portion (First Joint Portion)
10F Joint Portion
10G Flat Portion
10H Carrier Surface (First Carrier Surface)
10M Mounted Surface (First Mounted Surface)
11 Negative Electrode Terminal
11A Flat Portion (Second Flat Portion)
11B Shielding Portion (Second Shielding Portion)
11F Joint Portion (Second Joint Portion)
11G Joint Portion
11H Flat Portion
11J Mounted Surface (Second Mounted Surface)
11N Carrier Surface (Second Carrier Surface)
12 Package Resin
13 Conductive Silver Paste
16 Component
16A Power Supply Port
17 Power Supply Terminal
18 Power Line
19 Decoupling Capacitor
20 DC/DC Converter
21 Smoothing Capacitor (First Smoothing Capacitor)
22 Smoothing Capacitor (Second Smoothing Capacitor)
23 Capacitor for Removing Noises
107 Negative electrode
516 Component
516A Power Supply Port
516C Grounding Port
517 Power Supply Terminal
518A Power Line
518B Power Line
519 Decoupling Capacitor
520 DC/DC Converter
521 Smoothing Capacitor (First Smoothing Capacitor)
522 Smoothing Capacitor (Second Smoothing Capacitor)
523 Capacitor for Removing Noise
601 Multi-Layer Board
602 Conductive Layer
603 Conductive Layer (First Conductive Layer)
604 Conductive Layer (Second Conductive Layer)
D1 Insulating Layer
D2 Insulating Layer
D3 Insulating Layer
D4 Insulating Layer

DETAIL DESCRIPTION OF THE PREFERRED EMBODIMENTS

Exemplary Embodiment 1

Figure 1:
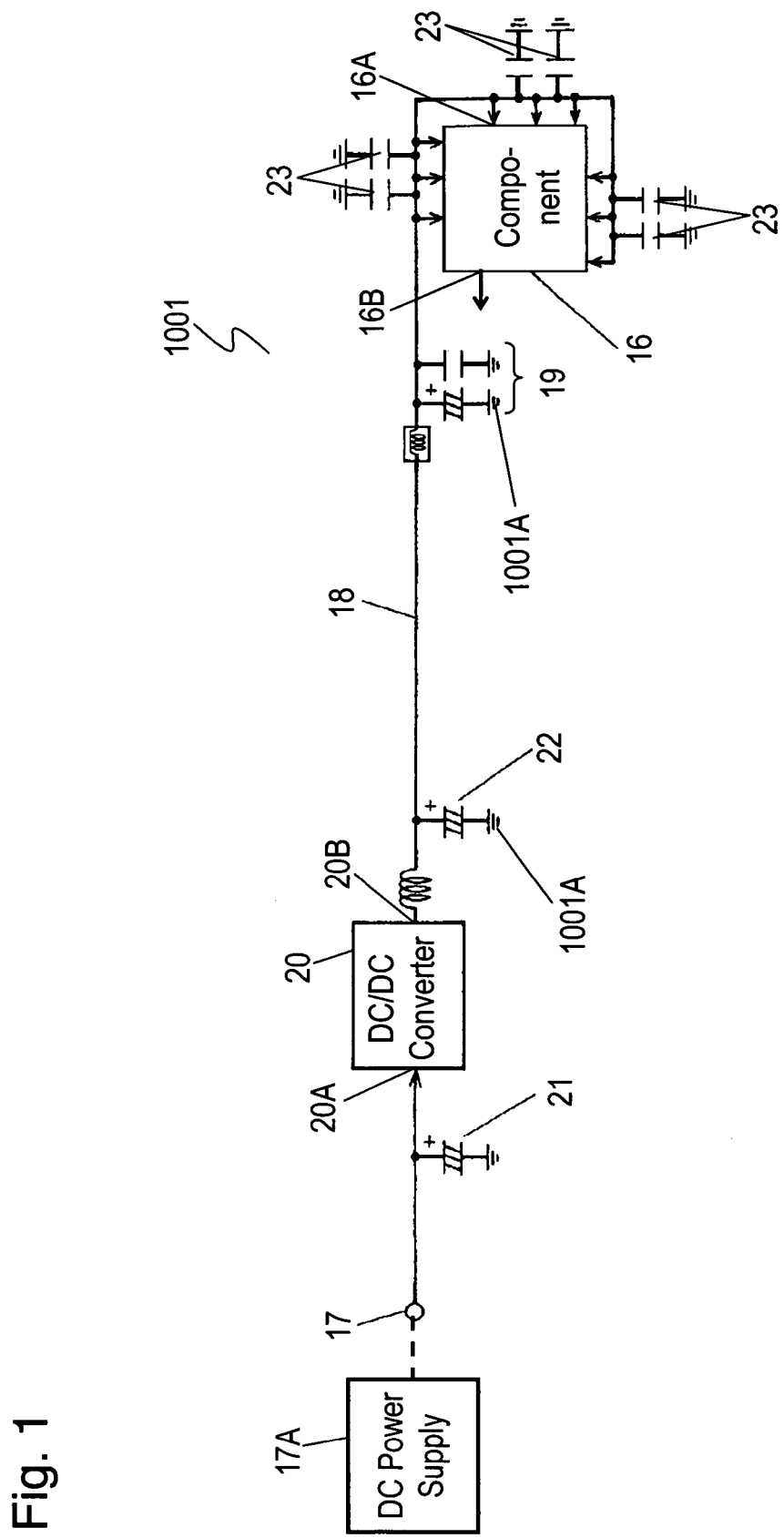
FIG. 1 is a circuit diagram of a digital signal processor according to Exemplary Embodiment 1 of the present invention.

FIG. 1 is a circuit diagram of a digital signal processor 1001 according to Exemplary Embodiment 1 of the present invention. The digital signal processor 1001 includes comprises a component 16, a power supply terminal 17, a power line 18, a decoupling capacitor 19, a DC/DC converter 20, smoothing capacitors 21 and 22, and capacitors 23 for removing noises. The component 16, a large-scale integrated circuit (LSI) having power supply ports 16A and a signal port 16B, processes a digital signal with a power supplied to the power supply ports 16A, and outputs the processed signal. The power supply terminal 17 is connected with a direct current (DC) power supply 17A. The power line 18 connects the power supply terminal 17 to the power supply ports of the component 16. The decoupling capacitor 19, a solid electrolyte capacitor, is connected between the power line 18 and a ground 1001A. The DC power supply 17A supplies a DC voltage to an input port 20A of the DC/DC converter 20. The DC/DC converter 20 converts the DC voltage and supplies the converted voltage to the power line 18 from an output port 20B. The smoothing capacitor 21 is connected between the input port 20A of the DC/DC converter 20 and the ground 1001A while the smoothing capacitor 22 is connected between the output port 20B of the DC/DC converter 20 and the ground 1001A. Each of the capacitors 23 is connected between each of the power supply ports 16A of the component 16 and the ground 1001A, and is generally a multi-layer ceramic capacitor.

The solid electrolyte capacitors used as the decoupling capacitor 19 and the smoothing capacitor 22 are surface mount type solid electrolyte capacitors including conductive polymer as solid electrolyte. Each of these capacitors has an equivalent series resistance (ESR) which is larger than zero and not larger than 25 m$\Omega$ at 100 kHz and has an equivalent series inductance (ESL) larger than zero and not larger than 800 pH at 500 MHz.

The capacitors 19 and 22 each having such small ESR and small ESL ensure that the voltage for driving the component 16. The component 16 operates in synchronization with a clock signal. The clock signal may generate high-frequency noises. The DC/DC converter 20 includes a switching element. The switching element may generate switching noises. The high-frequency noises and the switching noises flow to the ground 1001A through the capacitors 19 and 22, accordingly being prevented from transmitting along the power line 18.

Figure 2:
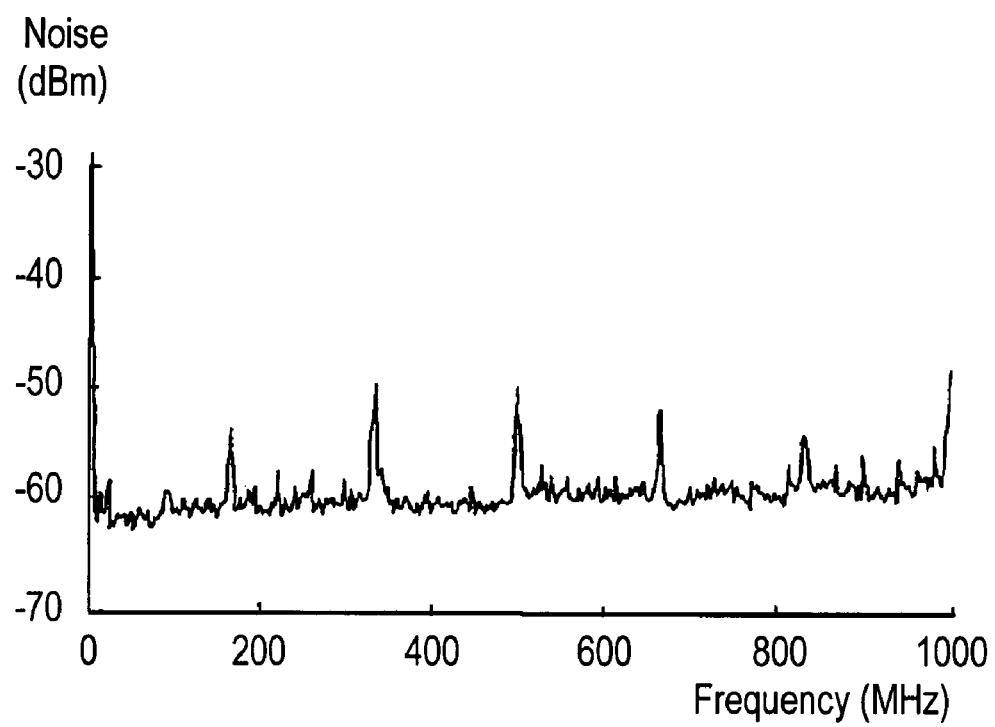
FIG. 2 illustrates a profile of a digital noise of the digital signal processor according to Embodiment 1.
Figure 13:
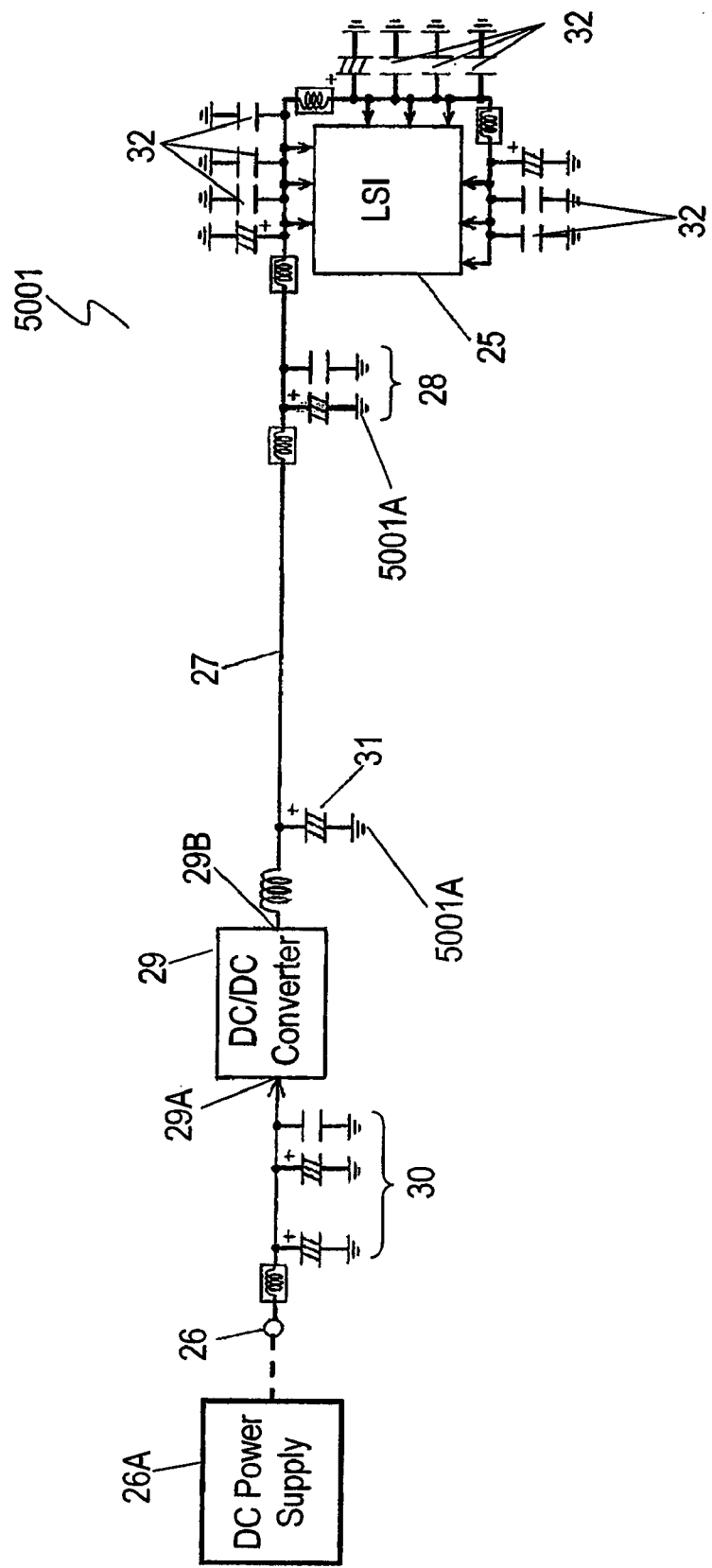
FIG. 13 is a circuit diagram of a conventional digital signal processor.
Figure 14:
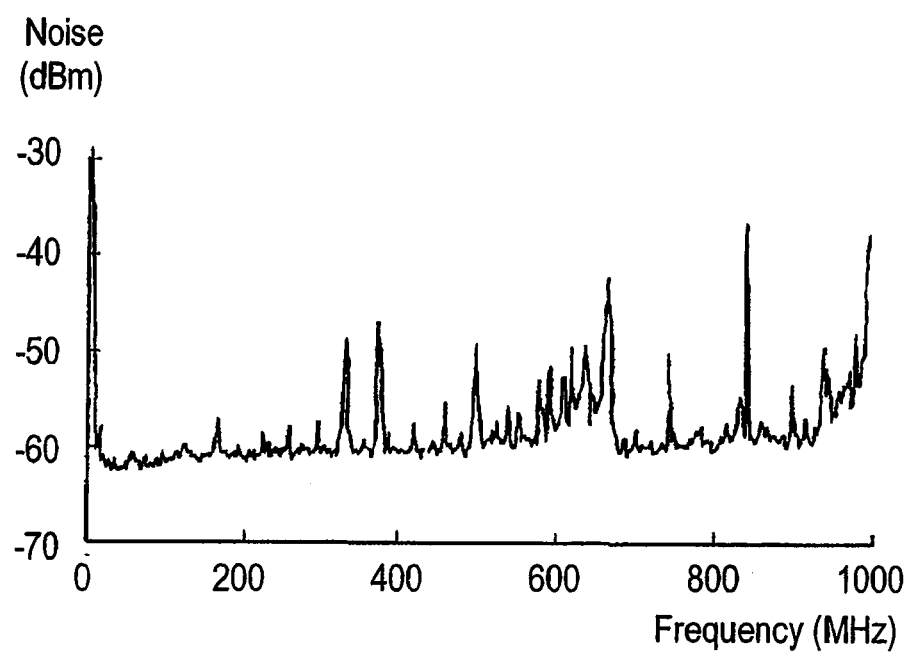
FIG. 14 is a profile of a digital noise of the conventional digital signal processor.

FIG. 2 illustrates a profile of a digital noise of the digital signal processor 1001 according to Embodiment 1. The digital noise generated in the digital signal processor 1001 is smaller than that in the conventional digital signal processor 5001 shown in FIG. 14. Further, the number of the capacitors 23 for removing noises shown in FIG. 1 can be reduced to ½ to ⅓ the number of the capacitors 32 shown in FIG. 13.

The digital signal processor 1001 according to Embodiment 1 includes the decoupling capacitor 19 and the smoothing capacitor 22 implemented by the solid electrolyte capacitors having the small ESR and ESL, thus significantly reducing the digital noise. The digital signal processor 1001 reduces the number of the capacitors 23 for removing noises, accordingly having a small, thin size and being inexpensive.

According to Embodiment 1, the smoothing capacitor 21 may be implemented by a solid electrolyte capacitor identical to that of each of the decoupling capacitor 19 and the smoothing capacitor 22.

Figure 3A:
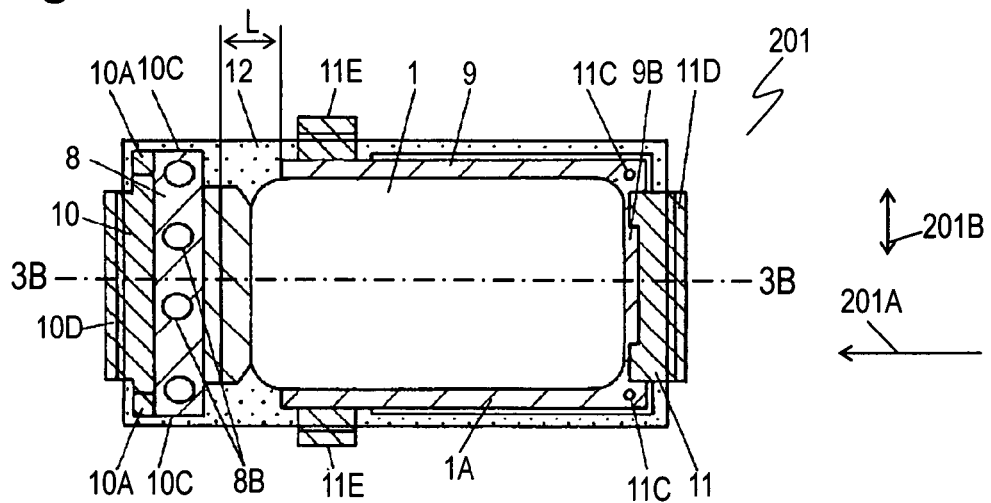
FIG. 3A is a plan cross sectional view of a solid electrolyte capacitor used in the digital signal processor according to Embodiment 1.
Figure 3B:
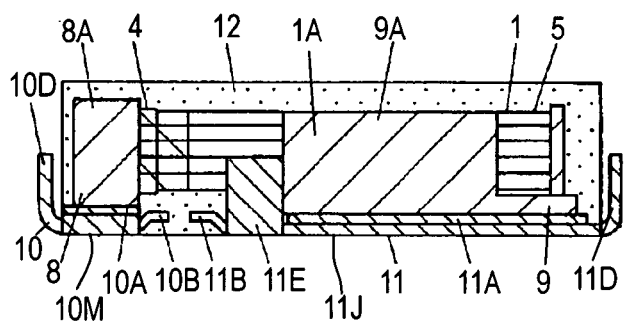
FIG. 3B is a front cross sectional view of the solid electrolyte capacitor taken along the line 3B-3B shown in FIG. 3A.
Figure 3D:
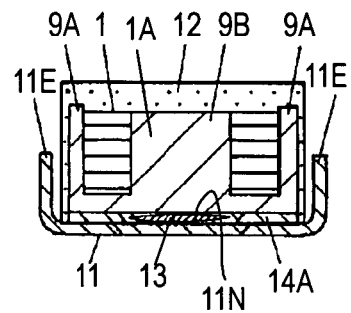
FIG. 3D is a side cross sectional view of the solid electrolyte capacitor shown in FIG. 3A.
Figure 3C:
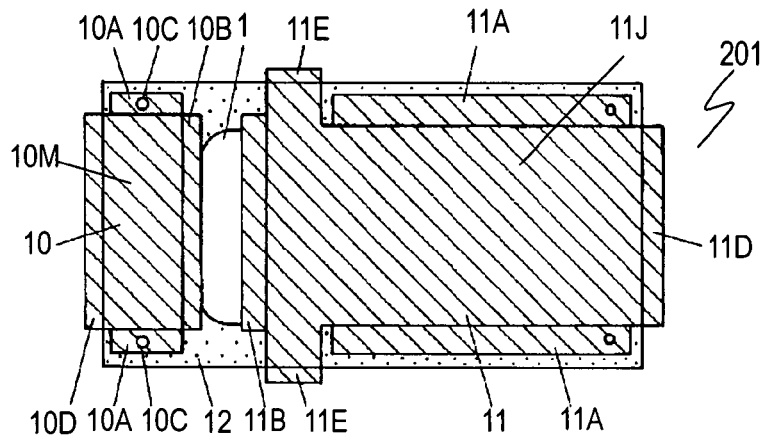
FIG. 3C is a bottom cross sectional view of the solid electrolyte capacitor shown in FIG. 3A.
Figure 4:
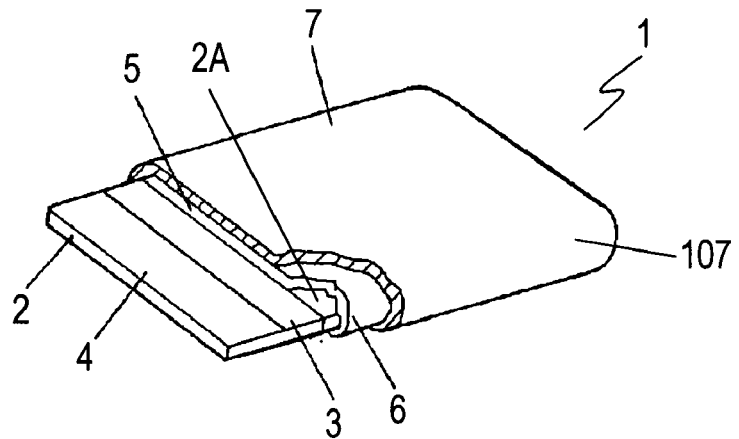
FIG. 4 is a partially cutout perspective view of a capacitor element of the solid electrolyte capacitor according to Embodiment 1.

FIG. 3A is a plan cross sectional view of a solid electrolyte capacitor 201 used as the decoupling capacitor 19 and the smoothing capacitor 22. FIG. 3B is a front cross sectional view of the solid electrolyte capacitor 201 taken along the line 3B-3B shown in FIG. 3A. FIGS. 3C and 3D are a bottom cross sectional view and a side cross sectional view of the solid electrolyte capacitor 201 shown in FIG. 3A, respectively. FIG. 4 is a partially cut away perspective view of a capacitor element 1 of the solid electrolyte capacitor 201.

The capacitor element 1 includes a positive electrode body 2, an insulating resist 3 having an insulating property, a solid electrolyte layer 6, and a negative electrode layer 7. The positive electrode body 2 is made of valve metal, such as aluminum foil. The positive electrode body 2 has a surface roughened, and an anodized layer 2A is provided on the surface. After the anodized layer 2A is provided, the positive electrode body 2 is separated into a positive electrode 4 and a negative electrode base 5 by the insulating resist 3. The solid electrolyte layer 6 is provided on a surface of the negative electrode base 5. The negative electrode layer 7 is made of carbon and silver paste applied on the solid electrolyte layer 6, thus providing a negative electrode 107.

Plural capacitor elements 1 (five elements according to Embodiment 1) are stacked so that respective positive electrodes 4 of the capacitor elements 1 are mounted over positive electrode frame 8. The positive electrode frame 8 is bent so that guide portions 8A provided at both ends of the frame hold the positive electrodes 4. The guides 8A and the positive electrodes 4 are welded together by laser welding at joint points 8B of the frame 8.

The capacitor elements 1 are stacked such that respective negative electrodes 107 of the capacitor elements 1 are bonded to a negative electrode frame 9 with a conductive adhesive. The negative electrode frame 9 has guide portions 9B provided at both ends thereof for positioning and securing the capacitor elements 1. The capacitor elements 1, the positive electrode frame 8, and the negative electrode frame 9 provide a capacitor element unit 1A.

Figure 5:
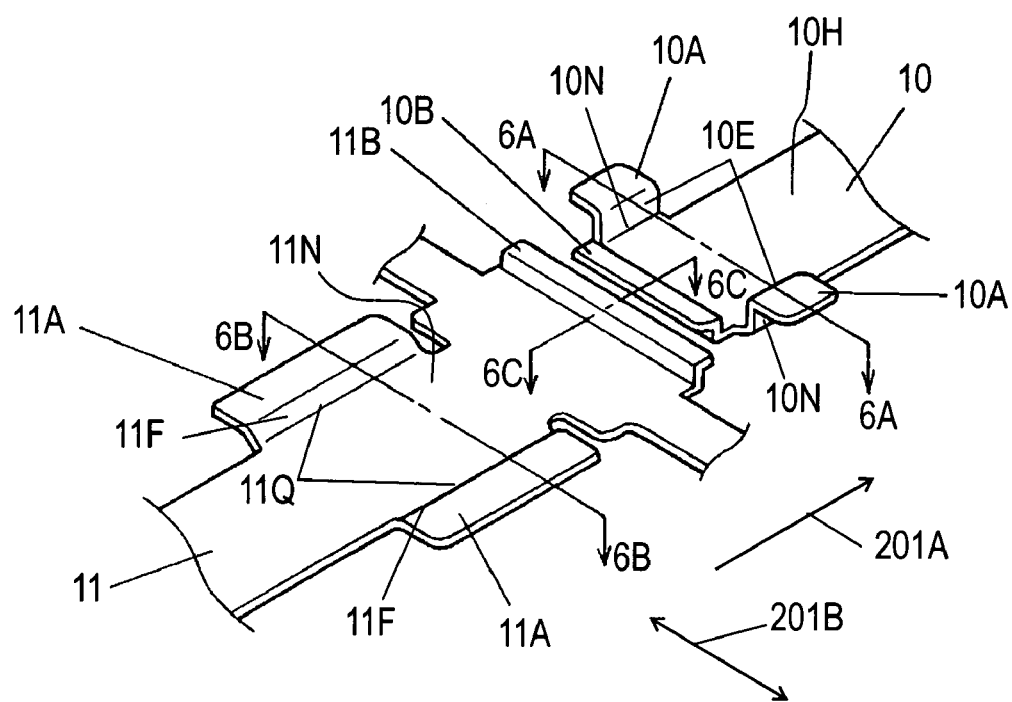
FIG. 5 is a perspective view of a positive electrode terminal and a negative electrode terminal of the solid electrolyte capacitor according to Embodiment 1.
Figure 6A:
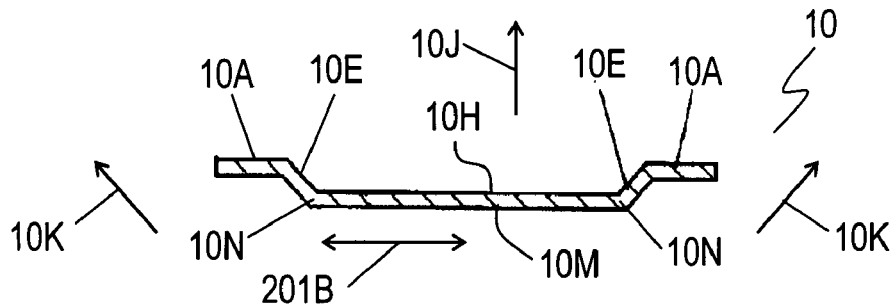
FIG. 6A is a cross sectional view of the positive electrode terminal and the negative electrode terminal taken along the line 6A-6A shown in FIG. 5.
Figure 6B:
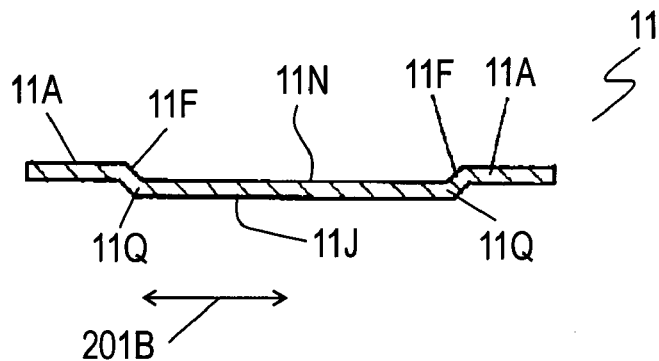
FIG. 6B is a cross sectional view of the positive electrode terminal and the negative electrode terminal taken along the line 6B-6B shown in FIG. 5.
Figure 6C:
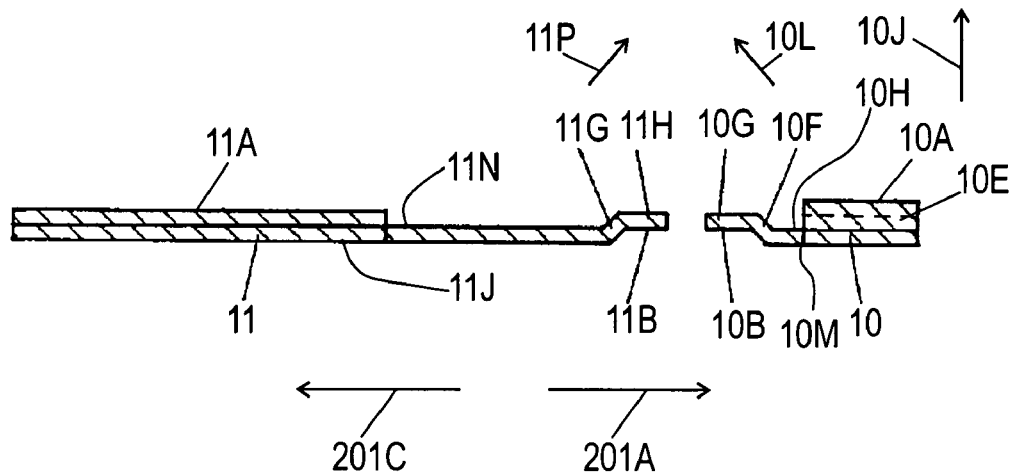
FIG. 6C is a cross sectional view of the positive electrode terminal and the negative electrode terminal taken along the line 6C-6C shown in FIG. 5.

FIG. 5 is a perspective view of a positive electrode terminal 10 and a negative electrode terminal 11 of the solid electrode capacitor 201. FIGS. 6A, 6B, and 6C are cross sectional views of the positive electrode terminal 10 and the negative electrode terminal 11 taken along the line 6A-6A, the line 6B-6B, and the line 6C-6C shown in FIG. 5, respectively. The positive electrode terminal 10 of the solid electrode capacitor 201 is located in the direction 201A from the negative electrode terminal 11. The positive electrode terminal 10 includes a carrier surface 10H, joint portions 10E, and flat portions 10A. The capacitor element unit 1A is mounted on the carrier surface 10H. The joint portions 10E extend in directions 10K from both ends arranged in a direction 201B crossing the direction 201A. The directions 10K direct outward from a direction 10J towards which the carrier surface faces. The flat portions 10A extend outward from the joint portions 10E and face towards the direction 10J. That if, the flat portions 10A provide step shapes via the joint portions 10E. A joint portion 10F extends in a direction 10L from an end of the carrier surface 10H opposite to the direction 201A. The direction 10L directs outward from the direction 10J. A shielding portion 10B extends from the joint portion 10F towards the negative electrode terminal 11. The shielding portion 10B has a flat surface 10G facing towards the direction 10J which the flat portions 10A face towards. More particularly, the flat portion 10B provides a step shape via the joint portion 10F. The positive electrode frame 8 of the capacitor element unit 1A is placed on the flat portions 10A, and welded by laser welding at joint points 10C. An extension 10D of the terminal 10 projects from a package resin 12. The extension 10D is bent upward along a side surface of the package resin 12. The carrier surface 10H, the joint portions 10E and 10F, the flat portions 10A, the shielding portion 10B, and the extension 10D are unitarily formed by punching and bending a single metal plate.

A lower surface 11J of the negative electrode terminal 11 functions as a mounted surface for mounting the solid electrolyte capacitor 201. The lower surface 11J has a shape substantively identical to that of the negative electrode 107 of the capacitor element 1, and allows the negative electrode terminal 11 to be as close to the positive electrode terminal 10 as possible. The negative electrode terminal 11 has joint portions 11F extending upward and slantingly in the direction 201B. Flat portions 11A coupled via joint portions 11F to the negative electrode frame 9 provide step shapes. A joint portion 11G extends upward and slantingly from a lower surface 11J to be a mounted surface in the direction 201A directing towards the positive electrode terminal 10. A shielding portion 11B provides a step shape via the joint portion 11G. The shielding portion 11B has a flat portion 11H. The negative electrode terminal 11 is formed by punching and bending a single metal plate. The negative electrode frame 9 of the capacitor element unit 1A is placed on the flat portions 11A, and is welded at joint points 11C by laser welding. The negative electrode terminal 11 has extensions 11D and 11E thereof project from the package resin 12 and is bent upward along side surfaces of the package resin 12. The negative electrode terminal 11 has a carrier surface 11N having the capacitor element unit 1A mounted thereon.

The package resin 12 is made of insulating resin, such as epoxy resin, and covers the capacitor element unit 1A such that a lower surface 10M of the positive electrode terminal 10 and the lower surface 11J of the negative electrode terminal 11 expose from the resin.

The positive electrode terminal 10 has the carrier surface 10H having the capacitor element unit 1A mounted thereon, and the carrier surface 10H is opposite to the lower surface 10M, the mounted surface. The negative electrode terminal 11 has the carrier surface 11N having the capacitor element unit 1A mounted thereon, and the carrier surface 11N is opposite to the lower surface 11J, the mounted surface. The shielding portion 10B has the joint portion 10F extending from the lower surface 10M in the direction 10L directing towards the negative electrode terminal 11 and the capacitor element unit 1A. The shielding portion 10B further has the flat portion 10G extends from the joint portion 10F in the direction 201C opposite to the direction 201A. The shielding portion 10B is covered with the package resin 12. The shielding portion 11B has the joint portion 11G extending from the lower surface 11J in a direction 11P directing towards the positive electrode terminal 10 and the capacitor element unit 1A. The shielding portion 11B further has the flat portion 11H extending from the joint portion 11G in the direction 201A. The shielding portion 11B is covered with the package resin 12.

The positive electrode terminal 10 has both ends 10N arranged in the direction 201B crossing the direction 201A. The positive electrode terminal 10 includes the joint portions 10E extending from both ends 10N and the flat portions 10A connected to the joint portions 10E, respectively. The joint portions 10E extend in directions directing away from the carrier surface 10H and crossing the carrier surface 10H. The flat portions 10A have flat shapes and extend in directions directing away from the carrier surface 10H.

The negative electrode terminal 11 has both ends 11Q arranged in the direction 201B crossing the direction 201A. The negative electrode terminal 11 includes the joint portions 11F extending from the both ends 11Q and the flat portions 11A extending from the joint portions 11F. The joint portions 11F extend in directions directing away from the carrier surface 11N and crossing the carrier surface 11N. The flat portions 11A have flat shapes and extending in directions directing away from the carrier surface 11N.

The capacitor element unit 1A is joined to the flat portions 11A of the negative electrode terminal 11. A gap between the negative electrode terminal 11 and the negative electrode frame 9 of the capacitor element unit 1A is filled with a conductive paste 13 including silver. This structure reduces a connection resistance at the joint between the negative electrode terminal 11 and the negative electrode frame 9, thus improving joining reliability.

Plural positive electrode terminals 10 and plural negative electrode terminals are provided in a base material having a hoop shape and made of copper alloy continuously at predetermined intervals. The capacitor element units 1A is placed and jointed onto each of the positive electrode terminals 10 and each of the negative electrode terminals 11 and is covered with the package resin 12 while the terminals are connected to each other. Then, they are separated from the base material, thereby providing chip shapes of the solid electrolyte capacitors 201.

The joint portions 10E, the flat portions 10A, the joint portion 10F, and the flat portion 10G of the shielding portion 10B of the positive electrode terminal 10 and the joint portions 11F, the flat portions 11A, the joint portion 11G, and the flat portion 11H of the shielding portion 11B of the negative electrode terminal 11 is covered with the package resin 12 and do not expose outside of the resin. The flat portions 10G and 11H provide the step shapes via the joint portions 10F and 11G, hence preventing the forming of rounded regions at the interfaces between the flat portions 10G and 11H and the lower surfaces 10M and 11J. This structure prevents resin of the package resin 12 from flowing to beneath the lower surfaces 10M and 11J, the mounted surfaces, of the terminals 10 and 11.

In the solid electrolyte capacitor 201 according to Embodiment 1, the positive electrode terminal 10 and the negative electrode terminal 11 having substantively planer shapes draw out the positive electrodes 4 and the negative electrodes 107 of the capacitor elements 1 by short distances, respectively. The lower surface 10M of the positive electrode terminal 10 and the lower surface 11J of the negative electrode terminal 11 are as close to each other as possible to minimize the length of the path between the positive electrode terminal 10 and the negative electrode terminal 11, hence providing the capacitor 201 with the small ESR and small ESL. The capacitor 201, in particular, has a small ESL of 500 pH, which is ⅓ the ESL of 1500 pH of the conventional capacitor.

The positive electrode frame 8 and the negative electrode frame 9 are welded by laser welding to the flat portions 10A and 11A of the positive and negative electrode terminals 10 and 11, and the flat portions 10A and 11A are covered with the package resin 12. Thus, welding spots provided on the flat portions 10A and 11A are covered with the package resin 12. This structure improves an external appearance of the capacitor 201 and avoids a floating effect which produces defects due to the welding spots during the mounting of the capacitor 201, thus increasing reliability.

The shielding portion 10B extends upward and slantingly from an end of the positive electrode terminal 10 towards the negative electrode terminal 11. The shielding portion 11B extends upward and slantingly from an end of the negative electrode terminal 11 towards the positive electrode terminal 10. The shielding portions 10B and 11B are covered with the package resin 12. The shielding portions 10B and 11B protect the capacitor elements 1 from being affected by oxygen contained in water entering through the package resin 12, thus providing the capacitor 201 with high reliability.

The positive electrode body 2 of the capacitor element 1 according to Embodiment 1 is made of aluminum foil, but may be made of foil or sintered form of tantalum, niobium, and mixture thereof.

Characteristics of the solid electrolyte capacitor 201 will be described.

Samples of the solid electrolyte capacitor 201 having various equivalent series resistances (ESRs) were prepared. FIG. 7 illustrates measured initial characteristics of each sample, a capacitance, the tangent of loss angle, an equivalent series inductance (ESL), and a leakage current. The leakage current was measured two minutes after the voltage of 10V was applied to the solid electrolyte capacitor 201. The solid electrolyte capacitor 201 had the rated voltage of 6.3V and the capacitance of 47 µF. FIG. 7 further shows a reduction rate, the ratio of the number of the capacitors 23 used for each sample of the capacitor 201 shown in FIG. 1 to the number of capacitors 23 of the conventional digital signal processor 5001 shown in FIG. 13.

As shown in from FIG. 7, the ESR not larger than 25 mΩ reduces the number of the capacitors 23 for removing digital noises effectively.

Samples of the solid electrolyte capacitor 201 including the positive electrode terminals 10 and the negative electrode terminals 11 distanced by various distances L were prepared. FIG. 8 illustrates measured initial characteristics of each sample, a capacitance, the tangent of loss angle, an equivalent series resistance (ESR), an equivalent series inductance (ESL), and a leakage current. The distance L is greater than zero.

As shown in FIG. 8, the shorter distance L between the positive electrode terminal 10 and the negative electrode terminal 11 provides a smaller ESL. The distance L which exceeds zero and which is not larger than 2 mm provides the ESL not larger than 800 pH, hence reducing the number of the capacitance 23 effectively.

As set forth above, the decoupling capacitor 19 and the smoothing capacitor 22 employing the solid electrolyte capacitors 201 according to this embodiment significantly reduce digital noises generated in the digital signal processor 1001. The number of the capacitors 23 for reducing the digital noises is accordingly reduced, and allows the digital signal processor 1001 to have a small, thin size and to be inexpensive.

Exemplary Embodiment 2

Figure 9:
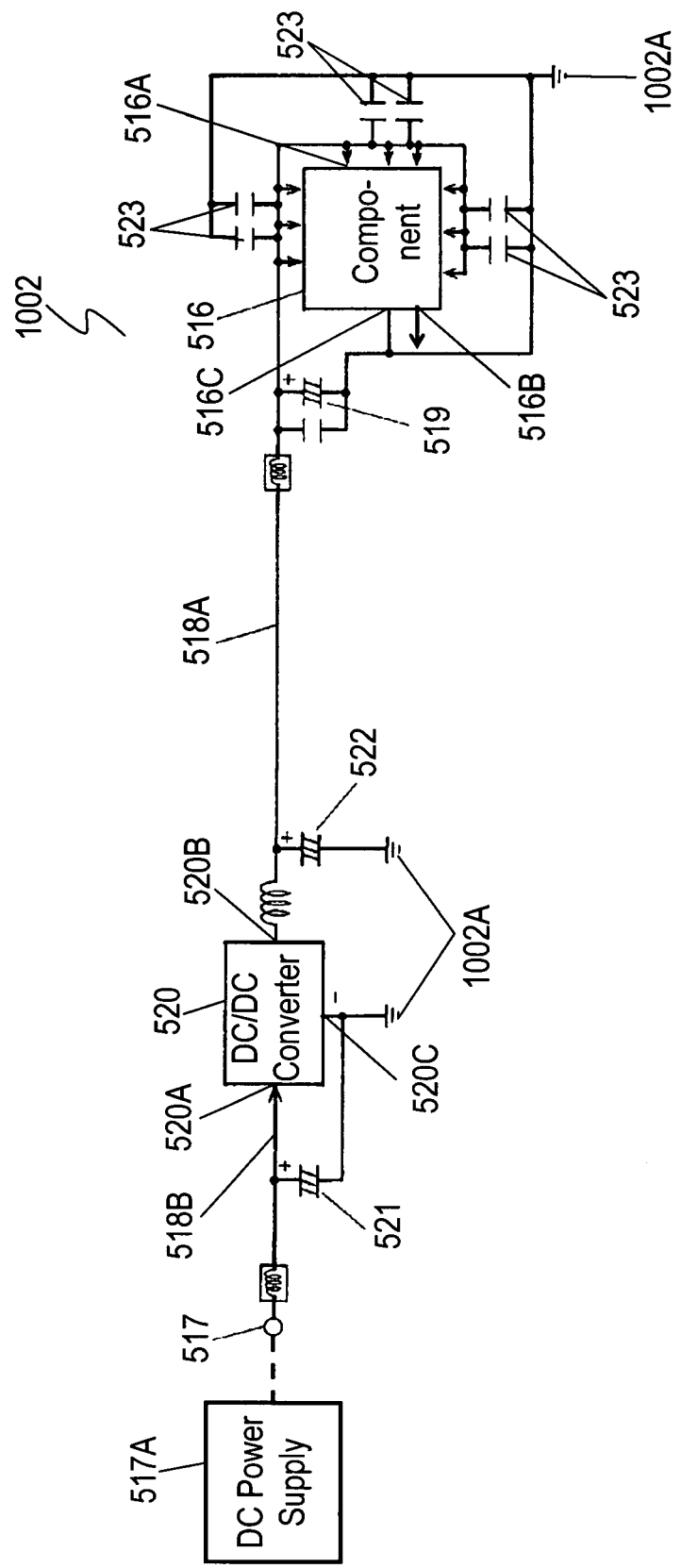
FIG. 9 is a circuit diagram of a digital signal processor according to Exemplary Embodiment 2 of the present invention.

FIG. 9 is a circuit diagram of a digital signal processor according to exemplary Embodiment 2 of the present invention. The digital signal processor 1002 includes a component 516, a power supply terminal 517, power lines 518A and 518B, a decoupling capacitor 519, a DC/DC converter 520, smoothing capacitors 521 and 522, and capacitors 523 for removing noises. The component 516, a large-scale integrated circuit (LSI) having power supply ports 516A and a signal port 516B, processes a digital signal with a power supplied to the power supply port 516A and outputs the processed signal. The power supply terminal 517 is connected with a direct current (DC) power supply 517A. The power line 518B connects the power supply terminal 517 to an input port 520A of the DC/DC converter 520. The power line 518A connects an output port 520B of the DC/DC converter 520 to the power supply ports 516A of the component 516. The decoupling capacitor 519, a solid electrolyte capacitor, is connected between the power line 518A and a ground 1002A. A DC voltage output from the DC power supply 17A is supplied via the power line 518B to the input port 520A of the DC/DC converter 520. The DC/DC converter 520 converts the DC voltage, and output the converted voltage from the output port 520B to the power line 518A. The smoothing capacitor 521 is connected between the input port 520A of the DC/DC converter 520 and the ground 1002A. The smoothing capacitor 522 is connected between the output port 520B of the DC/DC converter 520 and the ground 1002A. The component 516 has a grounding port 516C connected to the ground 1002A. The capacitors 523 are connected between the power supply ports 516A of the component 516 and the ground 1002A, and generally employing multi-layer ceramic capacitors.

Figure 10A:
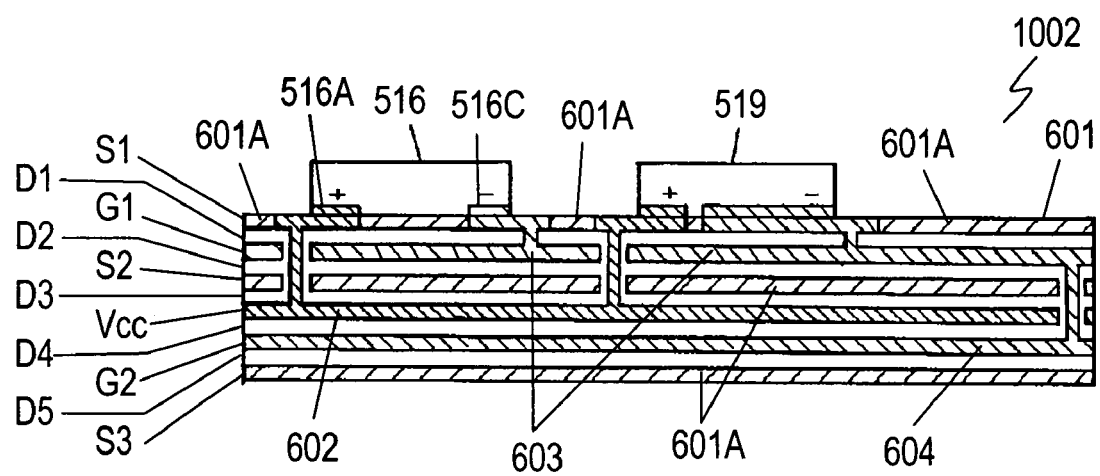
FIG. 10A is a cross sectional view of the digital signal processor according to Embodiment 2.
Figure 10B:
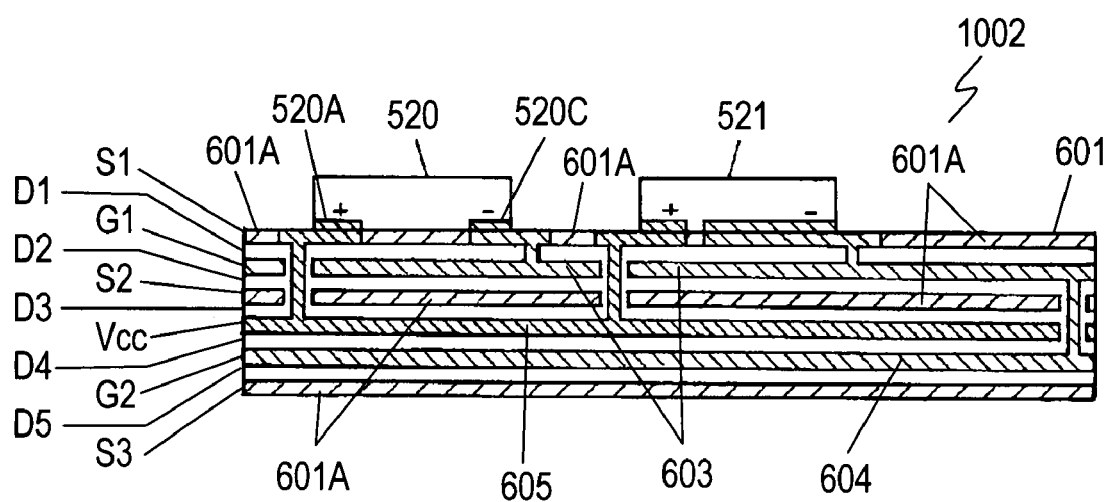
FIG. 10B is a cross sectional view of the digital signal processor according to Embodiment 2.
Figure 11:
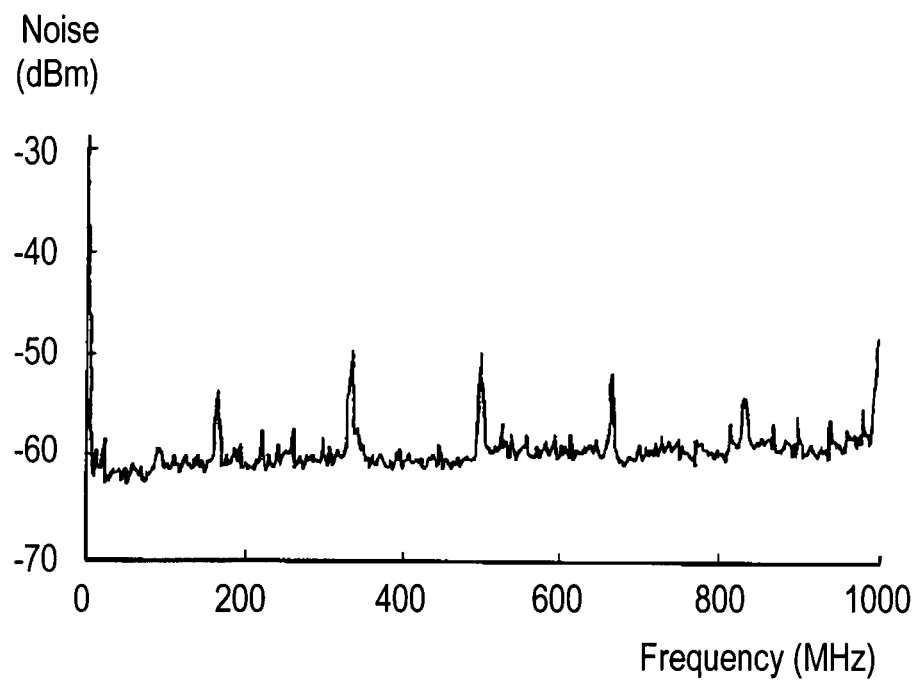
FIG. 11 is a profile of a digital noise of the digital signal processor according to Embodiment 2.

FIGS. 10A and 10B are cross sectional views of the digital signal processor 1002. The digital signal processor 1002 includes a multi-layer board 601 having the circuit shown in FIG. 9 mounted thereon, and the circuit includes the component 516, the DC/DC converter 520, and the capacitors 519, 521, 522, and 523. The multi-layer board 601 includes a layer S3, an insulating layer D5 provided on the layer S3, a layer G2 provided on the insulating layer D5, an insulating layer D4 provided on the layer G2, a layer Vcc provided on the insulating layer D4, an insulating layer D3 provided on the layer Vcc, a layer S2 provided on the insulating layer D3, an insulating layer D2 provided on the layer S2, a layer G1 provided on the insulating layer D2, an insulating layer D1 provided on the layer G1, and a layer S1 provided on the insulating layer D1.

As shown in FIG. 10A, the power line 518A shown in FIG. 9 is implemented by a conductive layer 602 provided on the layer Vcc. The ground 1002A is implemented by conductive layers 603 and 604 provided on the layers G1 and G2, respectively. The layers S1 to S3, G1, G2, and Vcc include these conductive layers and a resist 601A for insulating these conductive layers from each other. The decoupling capacitor 519 is connected between the conductive layer 602 as the power supply line 518A and the conductive layer 603. The power supply ports 516A of the component 516 are connected with the conductive layer 602. The grounding port 516C of the component 516, similarly to the decoupling capacitor 519, is connected to the conductive layer 603 provided at the layer G1 but not to the conductive layer 604 provided at the layer G2. The grounding port 516C of the component 516 is connected with the conductive layer 603 connected to the decoupling capacitor 519, and thus, is connected to the decoupling capacitor 519 by a short distance, accordingly reducing impedance produced at the ground 1002A.

In FIG. 10B, the power line 518B shown in FIG. 9 is implemented by a conductive layer 605 provided at the layer Vcc. The ground 1002A is connected with the layers 603 and 604 provided at the layers G1 and G2, respectively. The smoothing capacitor 521 is connected between the conductive layer 605 as the power line 516B and the conductive layer 603. The input port 520A of the DC/DC converter 520 is connected with the conductive layer 605. A grounding port 520C of the DC/DC converter 520, similarly to the smoothing capacitor 521, is connected to the conductive layer 603 provided at the layer G1 but not to the conductive layer 604 provided at the layer G2. The grounding port 520C of the DC/DC converter 520 is connected to the conductive layer 603 connected to the smoothing capacitor 521, and is connected to the smoothing capacitor 521 by a short distance, accordingly reducing impedance produced at the ground 1002A.

The decoupling capacitor 519 and the smoothing capacitor 522 employ the solid electrolyte capacitors according to Embodiment 1 shown in FIGS. 2 to 5 and 6A to 6C.

In the digital signal processor 1002 according to Embodiment 2, similarly to the digital signal processor 1001 according to Embodiment 1, the capacitors 519 and 522 each having such small ESR and small ESL ensure that the voltage for driving the component 516. The component 516 operates in synchronization with a clock signal. The clock signal may generate high-frequency noises. The DC/DC converter 520 includes a switching element. The switching element may generate switching noises. The high-frequency noises and the switching noises flow to the ground 1002A, i.e., the conductive layers 603 and 604, through the capacitors 519 and 522, accordingly being prevented from transmitting along the power line 518A. The decoupling capacitor 519 and the smoothing capacitor 522 employing the solid electrolyte capacitors 201 significantly reduce the digital noises. The number of the capacitors 23 for reducing the digital noises is accordingly reduced, and allows the digital signal processor 1001 to have a small, thin size and to be inexpensive.

Figure 12:
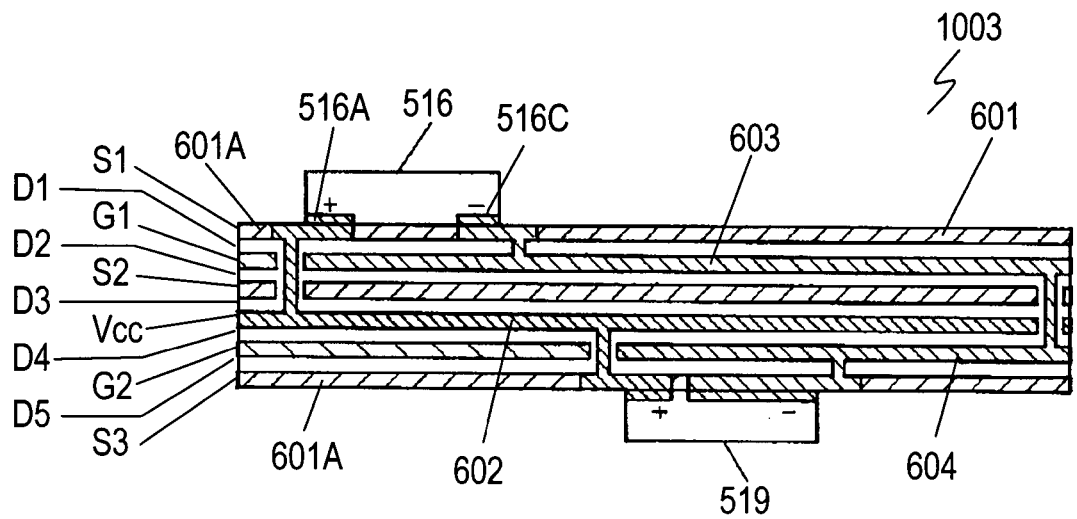
FIG. 12 is a cross sectional view of a comparative example of a digital signal processor.

FIG. 12 is a cross sectional view of a digital signal processor 1003 as a comparative example. The digital signal processor 1003, similarly to the digital signal processor 1002 shown in FIG. 10, includes a multi-layer board 601 mounting thereon the circuit shown in FIG. 9. In the digital signal processor 1003, the grounding port 516C of the component 516 is connected to the conductive layer 603 provided at the layer G1 while the decoupling capacitor 519 is connected to the conductive layer 604 provided at the layer G2. That is, the grounding port 516C of the component 516 is connected to the conductive layer 603 differently from the decoupling capacitor 519. This arrangement increases the distance between the grounding port 516C of the component 516 and the decoupling capacitor 519, and accordingly, increases impedance produced at the ground 1002A, thus reducing the effect for suppressing the digital noises.

According to Embodiment 2, the smoothing capacitor 521 may employ the solid electrolyte capacitor 201 identical to the decoupling capacitor 519 and the smoothing capacitor 522.

As set forth above, the decoupling capacitor 519 and the smoothing capacitor 522 employing the solid electrolyte capacitors 201 according to Embodiment 1 significantly reduce digital noises generated in the digital signal processor 1002. The number of the capacitors 523 for reducing the digital noises is accordingly reduced, and allows the digital signal processor 1002 to have a small, thin size and to be inexpensive.

INDUSTRIAL APPLICABILITY

A digital signal processor according to the present invention does not generate a lot of digital noise, and has a small, thin size. This processor is useful for electric appliances processing digital signals, particularly for a television receiver.

The invention claimed is:

1. A digital signal processor comprising:
 a component including a power supply port, for processing a digital signal with a power supplied to the power supply port;
 a power line for supplying the power to the power supply port of the component; and
 a decoupling capacitor connected between the power line and a ground, the decoupling capacitor having an equivalent series resistance larger than zero and not larger than 25 mΩ at 100 kHz and an equivalent series inductance larger than zero and not larger than 800 pH at 500 MHz.

2. The digital signal processor according to claim 1, wherein the decoupling capacitor comprises:
 a first capacitor element including a first solid electrolyte layer, a first positive electrode, and a first negative electrode, the first solid electrolyte layer comprising conductive polymer;
 a positive electrode terminal connected to the first positive electrode of the first capacitor element, the positive electrode terminal having a first mounted surface;
 a negative electrode terminal connected to the first negative electrode of the first capacitor element, the negative electrode terminal having a second mounted surface distanced from the first mounted surface by a distance larger than zero and not larger than 2 mm; and
 an insulating package resin covering the positive electrode terminal, the negative electrode terminal, and the first capacitor element, such that the first mounted surface and second mounted surface expose from the package resin.

3. The digital signal processor according to claim 2, wherein the second mounted surface of the positive electrode terminal has a shape substantially identical to a shape of the first negative electrode of the first capacitor element.

4. The digital signal processor according to claim 2, wherein
 the positive electrode terminal has a first carrier surface opposite to the first mounted surface, the first carrier surface having the first capacitor element placed thereon,
 the negative electrode terminal has a second carrier surface opposite to the second mounted surface, the second carrier surface having the first capacitor element placed thereon,
 the positive electrode terminal includes a first shielding portion covered with the package resin, the first shielding portion extending from the first mounted surface towards the first capacitor element and the negative electrode terminal, and
 the negative electrode terminal includes a second shielding portion covered with the package resin, the second shielding portion extending from the second mounted surface towards the positive electrode terminal and the first capacitor element.

5. The digital signal processor according to claim 4, wherein
 the positive electrode terminal and the negative electrode terminal are arranged in a predetermined direction,
 the positive electrode terminal has both ends arranged in a direction crossing the predetermined direction, and
 the positive electrode terminal further includes
  a first joint portion extending from each of the both ends of the positive electrode terminal in a direction which crosses the first carrier surface and which directs away from the first carrier surface, and
  a first flat portion connected to the first joint portion and extending in a direction directing away from the first carrier surface, the first flat portion having a flat shape.

6. The digital signal processor according to claim 5, wherein
 the negative electrode terminal has both ends arranged in a direction crossing to the predetermined direction, and
 the negative electrode terminal further includes
  a second joint portion extending from each of the both ends of the positive electrode terminal in a direction which crosses the second carrier surface and which directs away from the second carrier surface, and
  a second flat portion connected to the second joint portion and extending in a direction directing away from the second carrier surface, the second flat portion having a flat shape.

7. The digital signal processor according to claim 2, wherein the decoupling capacitor further comprises:
 a second capacitor element including a second solid electrolyte layer, a second positive electrode, and a second negative electrode, the second solid electrolyte layer comprising conductive polymer, the second capacitor element being stacked on the first capacitor element;
 a positive electrode frame connected to the first positive electrode, the second positive electrode, and the positive electrode terminal; and
 a negative electrode frame connected to the first negative electrode, the second negative electrode, and the negative electrode terminal.

8. The digital signal processor according to claim 1, further comprising:
 a DC/DC converter having an input port and an output port, the input port of the DC/DC converter being arranged to be connected to a power supply, the output port of the DC/DC converter being connected to the power line for supplying the power;
 a first smoothing capacitor connected to the input port of the DC/DC converter; and
 a second smoothing capacitor connected to the output port of the DC/DC converter, the second smoothing capacitor having an equivalent series resistance larger than zero and not larger than 25 mΩ at 100 kHz and an equivalent series inductance larger than zero and not larger than 800 pH at 500 MHz.

9. The digital signal processor according to claim 8, wherein the second smoothing capacitor comprises:
 a first capacitor element including a first solid electrolyte layer, a first positive electrode, and a first negative electrode, the first solid electrolyte layer comprising conductive polymer;
 a positive electrode terminal connected to the first positive electrode of the first capacitor element, the positive electrode terminal having a first mounted surface;
 a negative electrode terminal connected to the first negative electrode of the first capacitor element, the negative electrode terminal having a second mounted surface distanced from the first mounted surface by a distance larger than zero and not larger than 2 mm; and an insulating package resin covering the positive electrode terminal, the negative electrode terminal, and the first capacitor element, such that the first mounted surface and second mounted surface expose from the package resin.

10. The digital signal processor according to claim 9, wherein the second mounted surface of the positive electrode terminal has a shape substantially identical to a shape of the first negative electrode of the first capacitor element.

11. The digital signal processor according to claim 9, wherein the positive electrode terminal has a first carrier surface opposite to the first mounted surface, the first carrier surface having the first capacitor element placed thereon, the negative electrode terminal has a second carrier surface opposite to the second mounted surface, the second carrier surface having the first capacitor element placed thereon, the positive electrode terminal includes a first shielding portion covered with the package resin, the first shielding portion extending from the first mounted surface towards the first capacitor element and the negative electrode terminal, and the negative electrode terminal includes a second shielding portion covered with the package resin, the second shielding portion extending from the second mounted surface towards the positive electrode terminal and the first capacitor element.

12. The digital signal processor according to claim 11, wherein the positive electrode terminal and the negative electrode terminal are arranged in a predetermined direction, the positive electrode terminal has both ends arranged in a direction crossing the predetermined direction, and the positive electrode terminal further includes a first joint portion extending from each of the both ends of the positive electrode terminal in a direction which crosses the first carrier surface and which directs away from the first carrier surface, and a first flat portion connected to the first joint portion and extending in a direction directing away from the first carrier surface, the first flat portion having a flat shape.

13. The digital signal processor according to claim 12, wherein the negative electrode terminal has both ends arranged in a direction crossing to the predetermined direction, and the negative electrode terminal further includes a second joint portion extending from each of the both ends of the positive electrode terminal in a direction which crosses the second carrier surface and which directs away from the second carrier surface, and a second flat portion connected to the second joint portion and extending in a direction directing away from the second carrier surface, the second flat portion having a flat shape.

14. The digital signal processor according to claim 8, wherein the second smoothing capacitor further comprises:

a second capacitor element including a second solid electrolyte layer, a second positive electrode, and a second negative electrode, the second solid electrolyte layer comprising conductive polymer, the second capacitor element being stacked on the first capacitor element;

a positive electrode frame connected to the first positive electrode, the second positive electrode, and the positive electrode terminal; and a negative electrode frame connected to the first negative electrode, the second negative electrode, and the negative electrode terminal.

15. The digital signal processor according to claim 1, further comprising a board including a first conductive layer and an insulating layer provided on the first conductive layer, wherein the component further includes a grounding port connected to the conductive layer, and the decoupling capacitor is connected between the power line and the conductive layer.

16. The digital signal processor according to claim 15, wherein the board further includes a second conductive layer connected with the first conductive layer.

* * * * *